United States Patent [19]
Hathaway

[11] Patent Number: 5,944,834
[45] Date of Patent: Aug. 31, 1999

[54] TIMING ANALYSIS METHOD FOR PLLS

[75] Inventor: David J. Hathaway, Underhill Center, Vt.

[73] Assignee: International Business Machines Corporation, Armonk, N.Y.

[21] Appl. No.: 08/938,659

[22] Filed: Sep. 26, 1997

[51] Int. Cl.[6] .................................................. G06F 3/00
[52] U.S. Cl. ..................... 713/500; 327/147; 327/156; 713/400
[58] Field of Search ................................. 395/555, 551, 395/559; 375/119; 307/603; 327/147, 156

[56] References Cited

U.S. PATENT DOCUMENTS

| | | | |
|---|---|---|---|
| 4,924,430 | 5/1990 | Zasio et al. | 364/578 |
| 4,975,930 | 12/1990 | Shaw | 327/156 |
| 5,109,394 | 4/1992 | Hjerpe et al. | 375/119 |
| 5,287,025 | 2/1994 | Nishimichi | 307/603 |
| 5,619,170 | 4/1997 | Nakamura | 331/57 |
| 5,636,372 | 6/1997 | Hathaway et al. | 395/555 |
| 5,646,564 | 7/1997 | Erickson et al. | 327/158 |
| 5,666,322 | 9/1997 | Conkle | 327/147 |
| 5,818,304 | 10/1998 | Hogeboom | 327/147 |

*Primary Examiner*—Hassan Kizou
*Assistant Examiner*—Abu Hossain
*Attorney, Agent, or Firm*—Pollock, Vande Sande & Amernick; H. Daniel Schurmann

[57] ABSTRACT

A method of analyzing timing differences for common path pessimism removal for a circuit containing a locked loop which controls at least two legs of a clock tree is provided. The method comprises the steps of computing the early and late mode delays for the locked loop; computing the early and late mode delays for delay segments in the circuit; identifying delay segments in the feedback path which control the locked loop; and adjusting the early and late mode delays for the delay segments in the feedback path based upon the type of feedback control used in the circuit.

19 Claims, 2 Drawing Sheets

TIMING ANALYSIS METHOD FOR PLLS

TECHNICAL FIELD

The present invention relates generally to the field of static timing analysis of logic circuitry, and more particularly to a method for designing such circuitry to eliminate excessive pessimism from branch segments of a clock tree controlled by a phase locked loop clock tree which share a common path with the feedback path of the clock.

BACKGROUND OF THE INVENTION

In many types of logic circuits, logic networks which utilize both clock and data signals are often used. These networks may rely on close synchronization of the signals in order to operate properly. The data and clock signals are designed to arrive at particular logic gates at precise times. If a clock or data signal is expected at a particular logic gate at a precise time, and that clock or data signal arrives too early or too late, incongruous results may occur.

The design of logic circuitry is becoming increasingly complex, and yet the desire for increased speeds of operation and larger band widths still remain. Thus, the timing analysis of the logic networks must become more accurate and therefore any excessive pessimism in the design of the circuits should be removed. As used here, excessive pessimism refers to the use of conservative tolerances (or wide margins), so conservative or wide that they are not necessary for proper operation of the circuit. Just why the tolerances are too conservative will become clear below.

A phase locked loop is often used to control the arrival times of clock signals to latches and other clocked elements in some portion of a synchronous system. The phase locked loop compensates for process and environmental variations in the chip and thus reduces the variation in the clock arrival times between different portions of the system whose clocks are controlled by different phase locked loops. However, statistical variation can still cause significant differences across different branches of a clock tree sourced by a phase locked loop. The branch of the clock tree which supplies the feedback signal to the phase locked loop will be better synchronized with the data signals outside the influence of the phase locked loop, since the branch of the clock tree in the feedback loop exhibits variation only due to the jitter and phase error of the phase locked loop and not the additional variation across the clock tree. Thus, external synchronization will be better or worse depending on how much of the clock tree branch is in common with the feedback path which controls the phase locked loop. Current static timing analysis techniques do not account for this improved synchronization.

For example, U.S. Pat. No. 4,924,430 discloses a method of static timing analysis which accounts for various factors; such as wire capacitance and temperature. However, this method does not consider that the clock or data signals may share a common path. The method of U.S. Pat. No. 5,636,372 does account for the fact that signals in a circuit may share a common path. This method identifies signals which share common paths and merges their arrival times. These times are used to determine the slack, that is the difference between the actual arrival time of a signal at a point and the time the signal is required to arrive, for various points throughout the circuit. But here again there is no accounting that the feedback path will be more closely synchronized with the reference clock.

To take advantage of this improved synchronization requires a form of common path pessimism removal quite different from the prior art. More particularly, because of the accurate synchronization between the reference clock and the timing in the feedback path of the phase locked loop, little or no timing tolerance is required in that path. As a circuit location is removed further and further from the direct feedback path more and more timing tolerance is required. In the absence of this recognition, circuit designs exhibit common path pessimism in the feedback path and paths common thereto which can be safely removed in order to increase the efficiency of the circuit.

It is therefore an object of the invention to provide a method of removing excessive common path pessimism in timing analysis when analyzing circuits containing one or more phase locked loops, or other similar circuitry which is designed to align a clock distribution tree with a reference clock by comparing a clock signal fed back from a branch of the distribution tree with the reference clock and making delay adjustments in the arrival time at the phase locked loop output at the root of the distribution tree to realign the distributed clock with the reference clock.

SUMMARY OF THE INVENTION

A method of timing analysis for common path pessimism removal for a circuit having one or more clock distribution trees which are aligned by comparing a clock signal from a branch of said tree to a reference clock via a feedback path is provided. An embodiment of the invention first identifies the feedback path which controls the reference clock. Then, the early and late mode delays along the feedback path are modified to account for the fact that the branches of the tree in the feedback path are better synchronized with the data signals. The modification of the delays can depend on the type of feedback control, e.g., proportional, derivative or integral control.

According to another embodiment of the invention, the early and late mode delays for a locked loop are determined. Next, the early and late mode delays for delay segments in the circuit are determined. The delay segments in the feedback path controlling the locked loop are identified and the early and late mode delays for these delay segments are then modified based upon the type of feedback control used in the circuit. These early and late mode delays, along with other parameters, are then used to set the early and late mode arrival times for logic elements in the circuit.

According to another embodiment of the invention, the progression of the clock pulse through the circuit is identified. Next, the feedback path which controls the locked loop is identified. The early and late mode delays for the locked loop are determined and based on these delays, the early and late mode arrival times for at least one node following the locked loop in the progression is determined. Early and late mode delays for at least one delay segment immediately following the node in the progression of the clock pulse are determined based on the early and late mode arrival times of the node. If the delay segment is in the feedback path, the early and late mode delays are modified. The early and late mode arrival times at a sink node which immediately follows the delay segment in the progression of the clock pulse are determined based on the early and late mode delays for the delay segment, respectively, and the early and late mode arrival times at the source node of the delay segment, respectively. The determination of the early and late mode delays for delay segments and sink nodes is continued until the end of the progression of the clock pulse through the circuit is reached.

BRIEF DESCRIPTION OF THE DRAWINGS

The present invention will now be further described in the following pages of specification when taken in conjunction with the attached drawings, in which:

FIG. 2 is an example of a circuit the method of the present invention could be used on.

DETAILED DESCRIPTION OF THE INVENTION

The present invention provides a method for improving circuit efficiency by designing a circuit to eliminate excessive pessimism in branches of a clock tree whose leaf arrival times are aligned to a reference clock via a feedback signal. The invention is implemented in the context of a conventional static timing analysis which computes early and late mode arrival times and required arrival times at nodes of a delay graph. The separate early and late mode values are used to take into consideration the possible variations in the delays.

The late mode values are computed using maximum delays on each delay segment, while the early mode values are computed using minimum delay values on each delay segment. This background of static timing analysis is well known to those skilled in the art.

Figure 1:
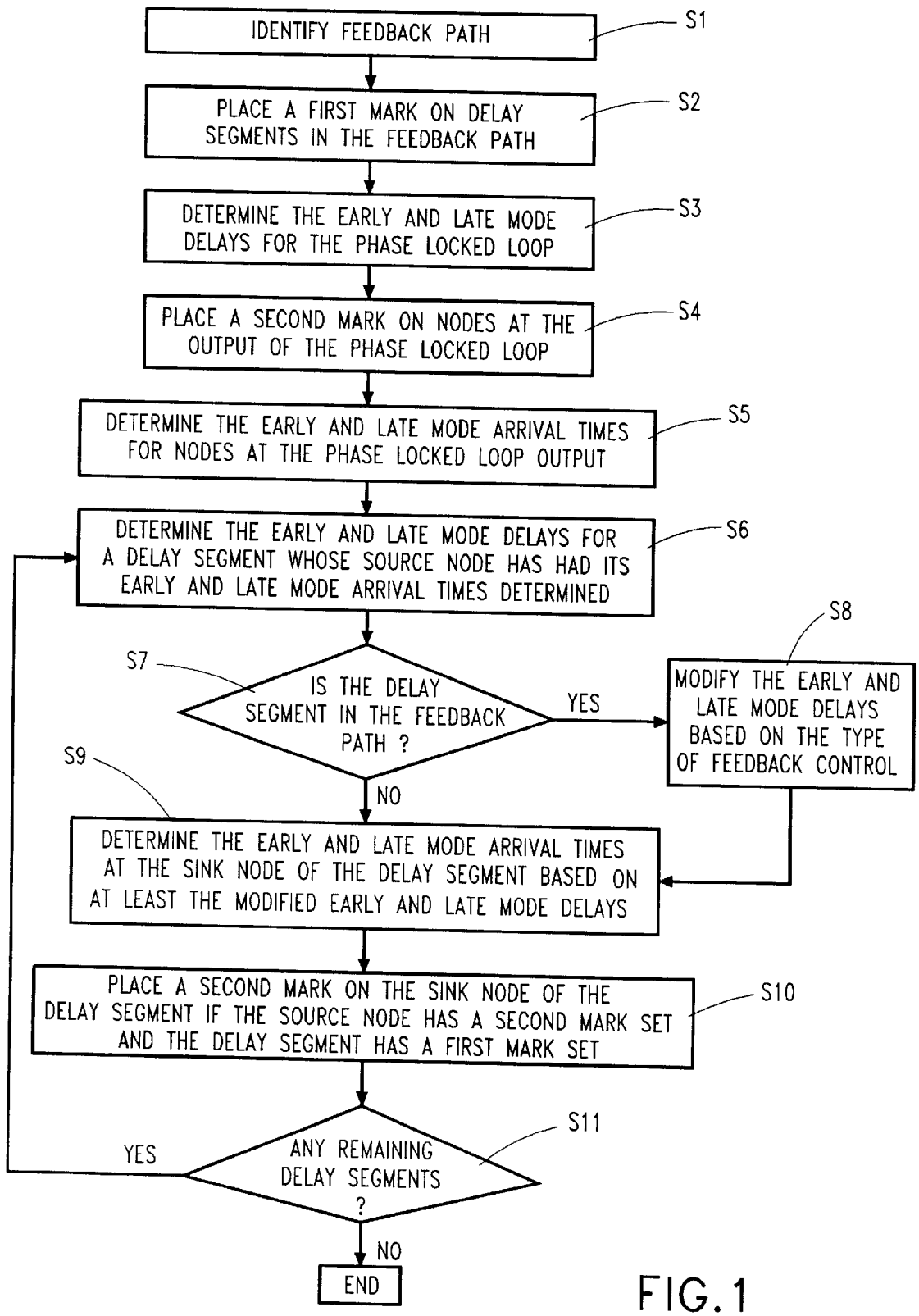
FIG. 1 is a flow diagram which shows a preferred method of 2timing analysis according to the present invention.
Figure 2:
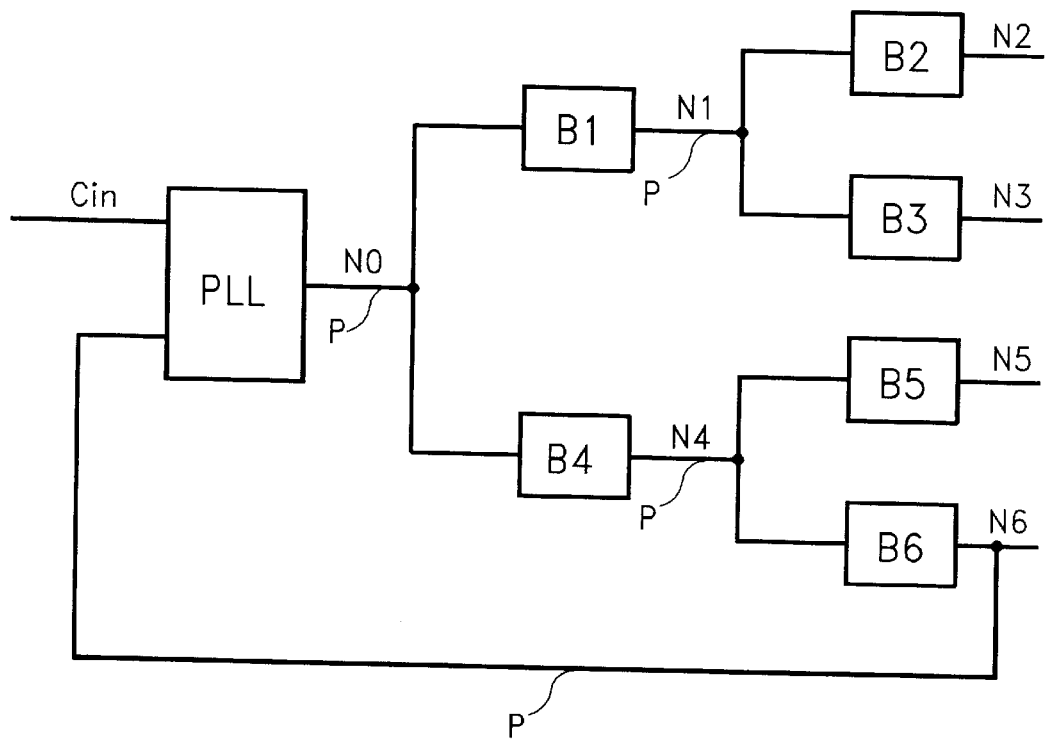

The present invention provides a method for analyzing the timing characteristics of a logic network in order to remove excessive common path pessimism. The steps used in an embodiment of the invention are illustrated in flow diagram form in FIG. 1. An example of a circuit the method could be used to remove pessimism from is shown in FIG. 2. Referring to FIGS. 1 and 2, the network includes a plurality of logic elements represented by various blocks B1–B6. The blocks are interconnected by conductive paths P. The blocks and conductive paths represent delay segments. A phase locked loop PLL is used to align multiple clock distribution trees with a common reference clock. This is done by comparing a clock signal fed back along a feedback path from a branch of the distribution tree with the reference clock. The arrival time at the output of the phase locked loop is adjusted to realign the distributed clock with the reference clock. The clock Cin is input into the phase locked loop PLL and then propagated throughout the logic network. Clock pulses are output from the phase locked loop PLL at a node N0. This node is the source node for blocks B1 and B4. Clock pulses propagate through blocks B1 and B4 and then enter delay segments through sink nodes N1 and N4, respectively. This propagation continues until the clock pulse reaches the end of the logic network, in FIG. 2, this is nodes N2, N3, N5 and N6.

The feedback path which controls the phase locked loop PLL is comprised of node N0, block B4, node N4, block B6, and node N6. The delay segments in the feedback path are more closely synchronized with the clocks controlled by the phase locked loop than the clocks derived from other branches of the clock distribution tree. The present invention takes this into account in the design of the timing margin. The method preferably includes identifying the feedback path which controls the phase locked loop and modifying the early and late mode delays used for delay segments in the feedback path. The modification made to the delays may vary based on the type of feedback control used. However, for the common phase locked loop situation, the modification will be interchanging the early and late mode delays for the delay segments in the feedback path; i.e., the reverse of the normal situation. These modified early and late mode delays will then be used along with other conventionally computed delays in the context described above to set the timing margins for the logic network.

The effect of this reversal of delays is to acknowledge the fact that if a delay segment in the feedback path controlling the phase locked loop has an extreme value for purposes of controlling the phase locked loop's effective delay, that same delay segment cannot have the opposite extreme value when propagating normal arrive times forward.

In one embodiment of the invention, a step S2 may be included to place a first mark on the delay segments which comprise the feedback path controlling the phase locked loop. These first marks could be set while the feedback path is being traced and would be used to identify delay segments which need to have new effective delays computed.

Another embodiment of the invention includes placing a second mark on nodes whose arrival times have been propagated from the phase locked loop's output rather than from some other side input, steps S4, S10. The second mark would be set on the phase locked loop's output and also on any other node whose arrival time is derived from a delay segment that has a first mark set and whose source node has a second mark set. In this embodiment, new effective delays would be computed only for those delay segments which have a first mark set and whose source nodes have a second mark set.

The effective delays on the phase locked loop's feedback path are used in computing the arrival times at the nodes in the feedback path, and therefore also in determining whether or not to set the second mark on these nodes. Thus, this embodiment requires that the arrival time be computed and the second mark set on the nodes in the feedback path before computing the effective delays on the delay segment which emanates from that node. Also, the effective delay must be computed for a delay segment before the arrival time is computed and the second mark is set on the sink node of that delay segment.

An example of the method of the present invention will now be given for the logic network shown in FIG. 2. For purposes of this example, so that the method of the invention can be clearly understood, assume that only block delays are present so that each node N0–N6 represents a single node in the delay graph and each block B1–B6 represents a single delay edge in the delay graph. Also assume that the minimum and maximum delays of each block B1–B6 are 4 and 8, respectively. Finally, assume that both the early and late mode arrival times at the Cin input of the phase locked loop are 0.

An initial step S1 of an embodiment of the invention calls for identifying the feedback path which controls the phase locked loop PLL. As mentioned above, this can be part of a pre-timing pass where the phase locked loop's feedback delay is computed to determine the effective delay from the oscillator input to the phase locked loop's output. Also during this preliminary pass step S2 can be done and first marks are placed on blocks B4 and B6 which comprise the feedback path controlling the phase locked loop PLL.

Next, the early and late mode delays for the phase locked loop are determined, step S3. The early mode delay for the phase locked loop is the negative of the sum of the unadjusted maximum delays along the feedback path controlling the phase locked loop minus a variation term for the phase locked loop. The variation term accounts for the static phase error of the phase locked loop and cycle-to-cycle and long term jitter. In this example a variation of +/−3 will be assumed. This term may be adjusted to include other variables. The late mode delay of the phase locked loop is the negative of the sum of the unadjusted minimum delays along the feedback path controlling the phase locked loop plus the variation term.

In our example, there are two blocks, B4 and B6, in the feedback path. The maximum delay for each block is 8 so the sum of the unadjusted maximum delays along the feedback path controlling the phase locked loop PLL would be 16. Correspondingly, the sum of the unadjusted minimum delays along the feedback path would be 8(=4+4). Using the above described equation, the early mode delay of the phase locked loop is determined to be −19(=−16−3). In a similar way, the late mode delay of the phase locked loop is determined to be −5(=−8+3).

Following step S4, a second mark is placed on node N0 indicating that it is the output of the phase locked loop. Step S5 calls for determining the early and late mode arrival times for the nodes at the output of the phase locked loop. In our example, this is node N0. The early and late mode arrival times on node N0 are the arrival time plus the early mode delay of the phase locked loop −19(=0+−19) and the arrival time plus the late mode delay of the phase locked loop −5(=0+−5), respectively.

Then following step S6, the effective delays on block B1 are determined. Since block B1 is not in the feedback path, step S7 goes directly to step S9, and the early and late mode delays of block B1 remain the minimum and maximum values of 4 and 8, respectively.

Step S9 calls for the early and late arrival times for the delay segment to be determined based on at least the early and late mode delays. The early and late mode arrival times at node N1 are determined to be −15(=−19+4) and +3(=−5+8), respectively.

Following step S10, since block B1 does not have the first mark set on it, no second mark is placed on node N1.

Since node N1 is not at the end of a clock tree branch, step S11 returns to step S6 to calculate delays on block B2. Since this block does not have a first mark on it, it is not identified as being in the feedback path. Therefore, step S7 goes directly to step S9 and the early and late mode delays for block B2 remain the minimum and maximum values of 4 and 8, respectively.

Following step S9, the early and late mode arrival times at node N2 are computed as −11(=−15+4) and +11(=+3+8), respectively. Since block B2 does not have the first mark set on it, step S10 does not place a second mark on node N2.

Since there are branches of the clock tree remaining, step S11 returns to step S6 in order to compute the effective delays on block B3. This block does not have a first mark on it. Step S7 recognizes this and goes directly to step S9. Thus, the early and late mode delays for block B3 remain the minimum and maximum values of 4 and 8, respectively.

Next, step S9 computes the early and late mode arrival times at node N3 as −11(=−15+4) and +11(=+3+8), respectively. Since block B3 does not have the first mark set on it, step S10 does not place a second mark on node N3.

Step S11 then returns to step S6 which computes the effective delays on block B4. This block has a first mark on it, indicating that it is part of the feedback path. Therefore, step S8 modifies the early and late mode delays of block B4 to the maximum and minimum values of 8 and 4, respectively (the reverse of the normal situation).

Next, step S9 computes the early and late mode arrival times at node N4 using the modified delays as −11(=−19+8) and −1(=−5+4), respectively. Since block B4 has a first mark set on and node N0 has a second mark set on it, step S10 places a second mark on node N4.

There are still delay segments remaining which need to be evaluated so step S11 returns to step S6 to compute the effective delays on block B5. Since this block does not have a first mark indicating it is in the feedback path, step S7 goes directly to step S9 and the early and late mode delays for block B5 remain the minimum and maximum values of 4 and 8, respectively.

Following step S9, the early and late mode arrival times at node N5 are computed as −7(=−11+4) and +7(=−1+8), respectively. Since block B5 does not have the first mark set on it, step S10 does not place a second mark on node N5.

Step S11 then returns to step S6 which computes the effective delays on block B6. Since this block has a first mark on it, it is in the feedback path. Thus, step S8 modifies the early and late mode delays of block B6 to the maximum and minimum values of 8 and 4, respectively (the reverse of the normal situation).

Next, step S9 computes the early and late mode arrival times at node N6 using the modified delays to be −3(=−11+8) and +3(=−1+4), respectively. Since block B6 has a first mark set on it and node N4 has a second mark set on it, a second mark is placed on node N6 by step S10.

Since there are no remaining delay segments, step S11 ends the process.

The following table summarizes the above calculations:

| Node | Early Mode Arrival Time | Late Mode Arrival Time |
| --- | --- | --- |
| N0 | −19 | −5 |
| N1 | −15 | +3 |
| N2 | −11 | +11 |
| N3 | −11 | +11 |
| N4 | −11 | −1 |
| N5 | −7 | +7 |
| N6 | −3 | +3 |

The more a clock tree branch is shared with the feedback path, the less variation there will be. Node N6 is directly connected to the phase locked loop. Therefore the early and late mode arrival times at node N6 are the positive and negative of the variation term, respectively. This is to be expected since the function of the phase locked loop terms is to cancel out all variation in the delay of the feedback path controlling it. Also note that the early and late mode arrival times at nodes N4 and N5 show less variation than those at nodes N2 and N3. This occurs because these nodes share part of a delay segment with the feedback path. The arrival times at each node will differ according to how much of the clock tree branch is shared with the feedback path.

Accordingly, a method for eliminating excessive pessimism from branches of a clock tree which share a common path with the feedback path of the clock has been provided. This method will allow circuits to be designed to operate at faster speeds and tighter timing margins.

While a preferred embodiment of the invention has been described above, since variations in the invention will be apparent to those skilled in the art, the invention should not be construed as limited to the specific embodiment described above. For example, the specific ordering of computing the delay and arrival times is arbitrary as long as the above dependencies are maintained.

I claim:

1. A method of analyzing timing differences for common path pessimism removal for a circuit containing a locked loop which controls at least two legs of a clock tree, said method comprising the steps of:

(a) computing effective early and late mode delays for the locked loop;

(b) computing effective early and late mode delays for delay segments;

(c) identifying delay segments in a feedback path controlling said locked loop; and (d) adjusting said effective early and late mode delays for delay segments in said feedback path based upon the type of feedback control used in said circuit.

2. The method of claim 1 further comprising the step of setting early and late mode arrival times based upon said adjusted effective early and late mode delays.

3. The method of claim 1 wherein step (c) comprises tracing said feedback path; and placing a first mark on said delays segments in said feedback path.

4. The method of claim 3 further comprising the step of placing a second mark on an output of said locked loop and all nodes which have said first mark and whose source node has said second mark.

5. The method of claim 1 wherein said effective early delay for said locked loop is a negative of the sum of maximum delays along said feedback path minus a variation constant.

6. The method of claim 1 wherein said late effective delay for said locked loop is a negative of the sum of minimum delays along said feedback path plus a variation constant.

7. The method of claim 1 wherein step (d) comprises interchanging said effective early and late mode delays of said delay segment.

8. A method of timing analysis for common path pessimism removal for a circuit having a locked loop controlling a clock tree having at least two legs, said method comprising the steps of:

(a) identifying a progression of a clock pulse through said circuit;

(b) identifying a feedback path which controls said locked loop;

(c) determining early and late mode delays for said locked loop;

(d) determining early and late arrival times for at least one node which are based on said early and late mode delays for said locked loop, respectively, said node having an arrival time propagated from said locked loop;

(e) determining early and late mode delays for at least one delay segment immediately following said node in said progression, said delays being based on said early and late arrival times of said node, respectively;

(f) modifying said early and late mode delays of said delay segment to remove common path pessimism if said delay segment is in said feedback path;

(g) determining early and late arrival times at a sink node which immediately follows said delay segment in said progression based on said early and late mode delays for said delay segment, respectively, and early and late arrival times at a source node of said delay segment, respectively; and (h) repeating steps (e)–(g) until an end of said progression is reached.

9. The method of claim 8 wherein step (b) further comprises setting a first mark on said delay segments in said feedback path.

10. The method of claim 9 further comprising the steps of:

setting a second mark on nodes whose arrival time is propagated from an output of said locked loop; and setting a second mark on nodes whose arrival time is derived from a delay segment which has said first mark set and whose source node has said second mark set.

11. The method of claim 10 wherein steps (a) and (b) are done during a pre-timing pass.

12. The method of claim 10 wherein said early and late mode delays for said delay segment are modified only for those delay segments which have said first mark and whose source nodes have said second mark.

13. The method of claim 12 wherein computing of said early and late arrival times of said source node of said delay segment and the setting of said second mark is completed before computing effective delays of said delay segment and computing of effective delays on delay segment is completed before computing arrival times and setting the second mark of a sink node.

14. The method of claim 8 wherein said early and late mode delays of said locked loop are a sum of the negative of unmodified delays along said feedback path minus constant and a sum of the negative of unmodified delays along said feedback path plus said constant, respectively.

15. The method of claim 14 wherein said constant corresponds to phase error and jitter of said locked loop.

16. The method of claim 8 wherein step (f) is based on the type of feedback control.

17. The method of claim 8 wherein step (f) comprises interchanging said early and late mode delays for said delay segment.

18. The method of claim 8 wherein said late mode arrival time of said node is a maximum over all delay segments directly feeding said node plus said late mode delay of said delay segment.

19. The method of claim 8 wherein said early mode arrival time is a minimum over all delay segments directly feeding said node plus said early mode delay of said delay segment.

* * * * *